(12) United States Patent
Park

(10) Patent No.: US 7,539,025 B2
(45) Date of Patent: May 26, 2009

(54) METHOD OF REDUCING ELECTROMAGNETIC INTERFERENCE AND CIRCUIT CONNECTION DEVICE USING THE SAME

(75) Inventor: Kun-young Park, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 9 days.

(21) Appl. No.: 11/151,347

(22) Filed: Jun. 14, 2005

(65) Prior Publication Data

US 2006/0087823 A1    Apr. 27, 2006

(30) Foreign Application Priority Data

Oct. 4, 2004    (KR)    ...................... 10-2004-0078741

(51) Int. Cl.
*H05K 1/11* (2006.01)

(52) U.S. Cl. ........................................ 361/792; 439/498

(58) Field of Classification Search ................. 361/792; 439/498, 492

See application file for complete search history.

(56) References Cited

U.S. PATENT DOCUMENTS

| | | | |
|---|---|---|---|
| 4,498,715 A | | 2/1985 | Peppler |
| 4,644,092 A | | 2/1987 | Gentry |
| 5,387,113 A | * | 2/1995 | Dickerson et al. .............. 439/98 |
| 5,532,429 A | * | 7/1996 | Dickerson et al. .............. 174/36 |
| 5,680,297 A | | 10/1997 | Price et al. |
| 6,824,401 B2 | * | 11/2004 | Kuo et al. ...................... 439/92 |
| 2004/0097111 A1 | | 5/2004 | Kuo et al. |
| 2005/0087430 A1 | * | 4/2005 | Ette et al. ................ 200/50.01 |

FOREIGN PATENT DOCUMENTS

| | | |
|---|---|---|
| JP | 02-267852 | 11/1990 |
| KR | 2000-2543 A | 1/2000 |
| KR | 2000-7294 | 4/2000 |
| KR | 2002-17774 A | 3/2002 |
| KR | 2004-37766 A | 5/2004 |

OTHER PUBLICATIONS

Chinese Office Action dated Dec. 21, 2007 issued in CN 2005101037875.

* cited by examiner

*Primary Examiner*—Dean A. Reichard
*Assistant Examiner*—Abiy Getachew
(74) *Attorney, Agent, or Firm*—Stanzione & Kim, LLP

(57) ABSTRACT

A device and a method of reducing electromagnetic interference resulting from a harmonic wave produced by a signal transmitted through a harness. The method includes winding a conductive wire at least once around the harness, and grounding at least one end of the conductive wire. Accordingly, the electromagnetic interference reducing method is capable of reducing electromagnetic interference without any side effects by using a low cost and a simple ground line.

18 Claims, 6 Drawing Sheets

METHOD OF REDUCING ELECTROMAGNETIC INTERFERENCE AND CIRCUIT CONNECTION DEVICE USING THE SAME

CROSS-REFERENCE TO RELATED APPLICATIONS

This application claims the priority under 35 U.S.C. § 119 of Korean Patent Application No. 2004-78741, filed on Oct. 4, 2004, in the Korean Intellectual Property Office, the disclosure of which is incorporated herein in its entirety by reference.

BACKGROUND OF THE INVENTION

1. Field of the Invention

The present general inventive concept relates to signal transmission of an electronic device, and more particularly, to a method of reducing an effect of electromagnetic waves which are emitted from a harness that transmits a signal.

2. Description of the Related Art

A high frequency signal flowing along a transmission path radially emits an electromagnetic field. The strength of the electromagnetic field is directly proportional to the power of the signal.

In an electronic device, a plurality of signal lines are used in a harness connected between two connectors in order to electrically connect circuit parts. A harmonic component of the signal transmitted through the harness is emitted, resulting in electromagnetic interference (EMI). The EMI becomes more severe as the frequency of the transmitted signal increases and the length of harness increases.

FIG. 1 is a schematic diagram of a circuit system in a conventional printer system. Referring to FIG. 1, the circuit system includes a power supply unit 102, a laser scanning unit 104, a CCD (charge-coupled device) unit 106, an ADF (auto document feeder) unit 108, and an operation unit 110.

A main controller 102a of the power supply unit 102 is connected to the laser scanning unit 104, the CCD unit 106, the ADF unit 108, and the operation unit 110 by harnesses 122, 124, 126, and 128, respectively.

Several MHz signals and several tens of MHz signals are transmitted through the harnesses 122, 124, 126, and 128. During the transmission of the signals, the harnesses 122, 124, 126, and 128 are main sources of harmonic emission. The harmonic components emitted from the harnesses 122, 124, 126, and 128 have an adverse effect on peripheral electronic devices, and may cause a malfunction of the printer. Therefore, a method of reducing harmonic components emitted through harnesses 122, 124, 126, and 128 is needed.

Conventional methods of reducing harmonic emission from a harness include the use of a ferrite core, the use of LVDS (low voltage differential signaling), and shielding of the whole harness.

Ferrite, which is a magnetic material used to absorb electromagnetic emission from a wire or a cable, is cylindrical, block-shaped, or core-shaped. Signal lines are inserted in or wound around a ferrite core. FIG. 2 is a perspective view of a conventional connector in which a ferrite core 202 is used.

However, when a ferrite core is used, there are disadvantages in that the production cost of a device increases as much as the price of the ferrite core and the length of a harness should be extended according to how many times the harness is wound around the ferrite core. Although the ferrite core can filter different harmonic domains according to the size and material of the ferrite core, if a length of the harness changes, a problem may occur in other frequency domains.

LVDS, in which a signal is converted to a low voltage differential signal and transmitted, has been widely used to prevent electromagnetic interference in printers, laptop computers, and liquid crystal displays (LCD).

FIG. 3 is a block diagram of a conventional circuit to which LVDS is applied. To transmit a signal using LVDS, a transmitting part should include an LVDS transmitter 302 and a receiving part should include an LVDS receiver 304.

While transmitting a signal using LVDS can effectively reduce electromagnetic waves, a large expense is incurred to realize the LVDS, and since LVDS is used for main signal lines, it is difficult to handle the harmonic frequency induced on other signal lines and emitted therefrom.

EMI noise can be diminished by shielding the whole harness with a metal conducting surface which is connected to a ground. However, signal distortion may occur due to a parasitic capacitance between the metal conducting surfaces or between the metal conducting surface and signal lines, and production costs can be increased.

SUMMARY OF THE INVENTION

The present general inventive concept provides an electromagnetic interference reducing method capable of efficiently reducing electromagnetic interference generated by a harness.

The present general inventive concept also provides a circuit connection device using the electromagnetic interference reducing method.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a method of reducing electromagnetic interference resulting from a harmonic wave emitted from a signal which is transmitted through a harness, the method including winding a conductive wire at least once around the harness, and grounding at least one end of the conductive wire.

During the winding of the conductive wire around the harness, a space may be maintained between turns of the conductive wire according to the equation $L \leq 1/(20*F_{max}) = \lambda_{min} * 1/20$, where $F_{max}$ and $\lambda_{min}$ are a highest frequency and a shortest wavelength of the harmonic wave, respectively, and L is the space between the turns of the conductive wire.

The foregoing and/or other aspects of the present general inventive concept are achieved by providing a circuit connection device to transmit a signal between separated electronic circuits, the circuit connection device including a plurality of signal lines, and a ground line winding at least once around the plurality of signal lines, wherein at least one end of the ground line is connected to a ground.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
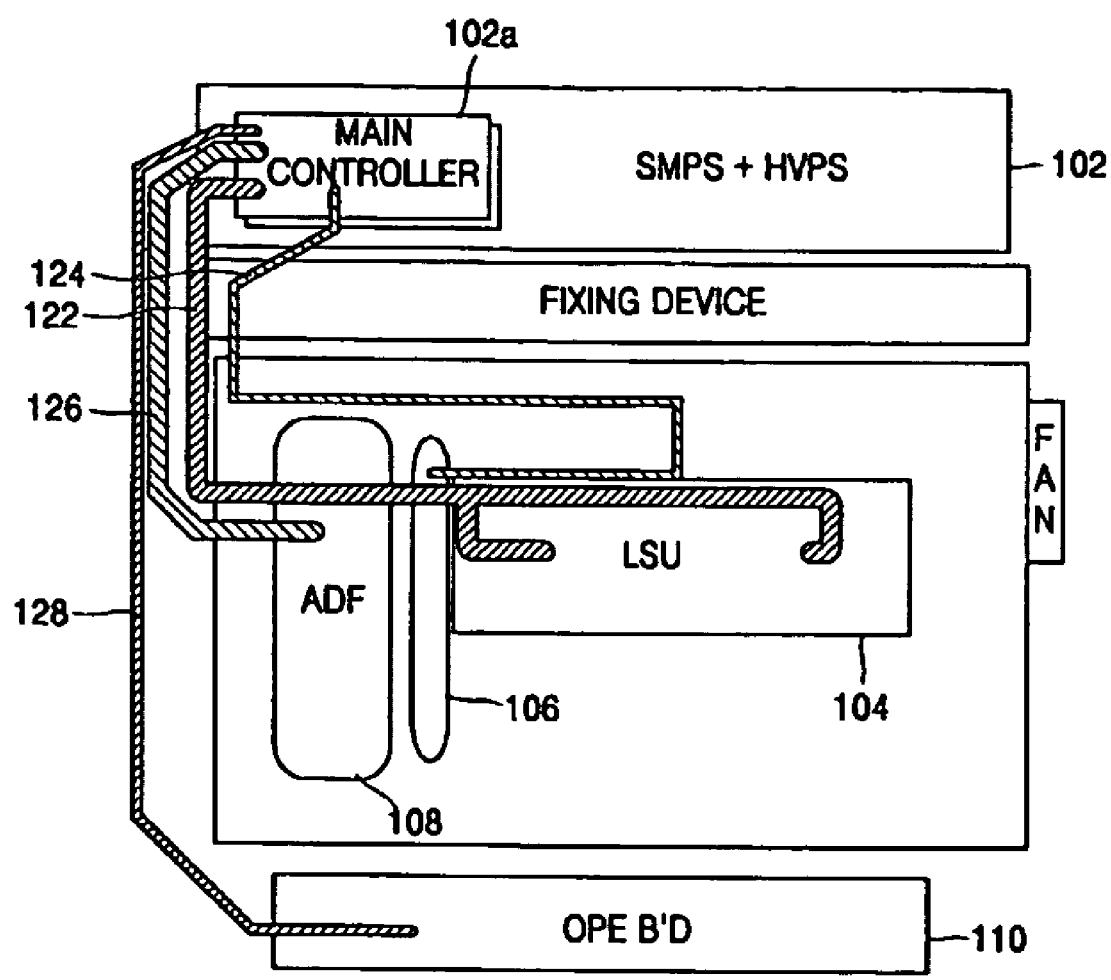
FIG. 1 is a schematic diagram of a circuit system in a conventional printer system.
Figure 2:
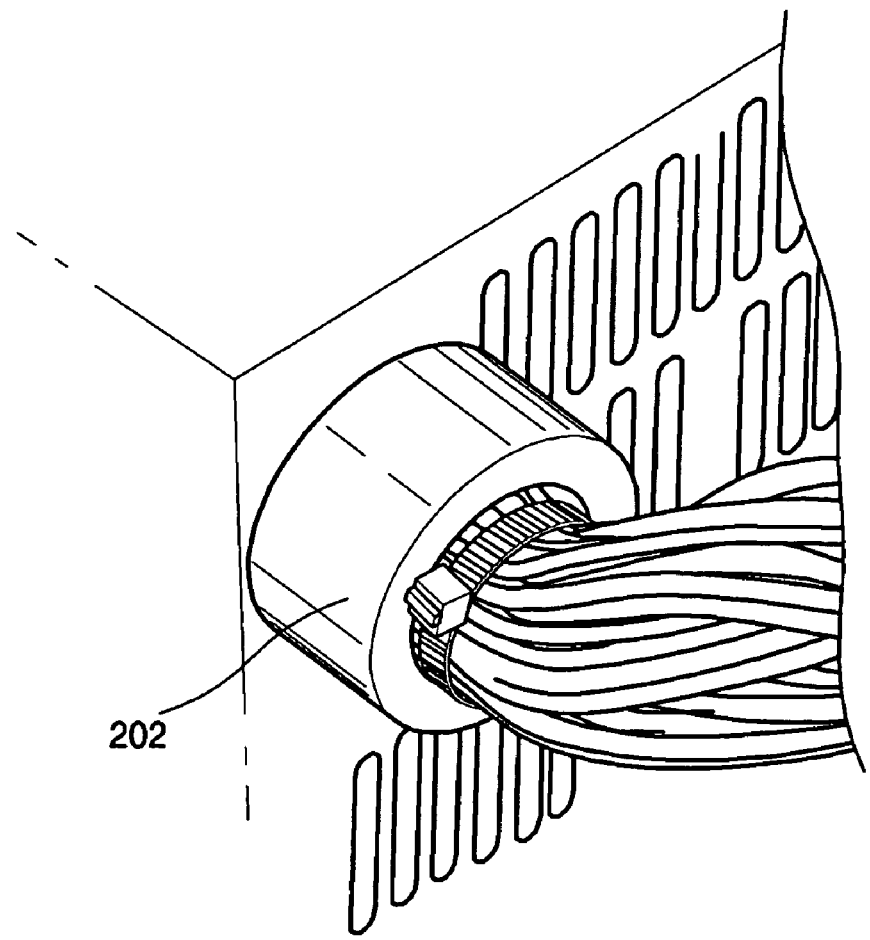
FIG. 2 is a perspective view of a conventional connector in which a ferrite core is used.
Figure 3:
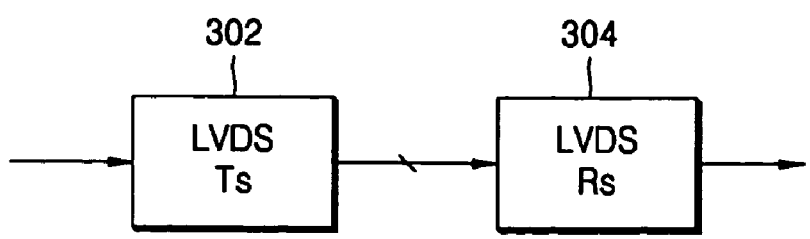
FIG. 3 is a block diagram of a conventional circuit to which LVDS is applied.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 4:
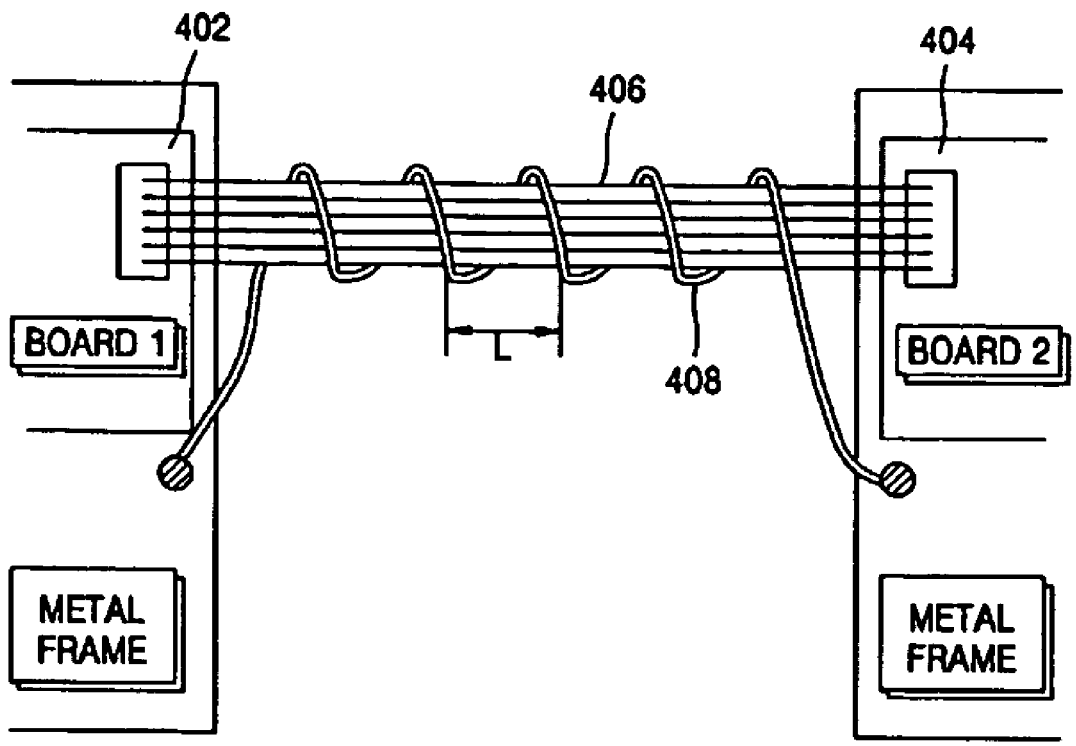
FIG. 4 is a diagram illustrating a circuit connection device according to an embodiment of the present general inventive concept.

FIG. 4 is a diagram illustrating a circuit connection device according to an embodiment of the present general inventive concept. Referring to FIG. 4, the circuit connecting device includes a harness 406 to transmit a signal connecting two circuit boards 402 and 404 and a ground line 408 which is wound around the harness 406 at least once and is connected to a ground. As illustrated in FIG. 4, the ground line 408 is grounded through a metal frame in which the circuit boards 402 and 404 are installed.

The ground line 408 is wound around the harness 406 at least once. A space L between turns of the ground line 408 can satisfy the equation, $L \leq 1/(20*Fmax) = \lambda min * 1/20$, where Fmax is a highest frequency of harmonic frequencies emitted from the harness 406, specifically, the frequency causing an EMI problem, and $\lambda min$ is a wavelength of a harmonic wave corresponding to the highest frequency Fmax. That is, $\lambda min$ is a minimum wavelength of harmonic waves emitted from the harness 406. The ground line 408 may be a conductive wire, but a coated line can be used as well.

While the ground line 408 is wound around the harness 406, the ground line 408 can be attached or fastened to the harness 406 such that the space L is maintained constant so as not to be changed by an external force.

Figure 5:
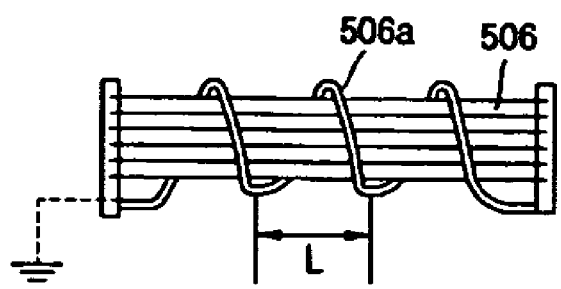
FIG. 5 is a diagram illustrating a circuit connection device according to another embodiment of the present general inventive concept.

FIG. 5 is a diagram illustrating a circuit connection device according to another embodiment of the present general inventive concept. Referring to FIG. 5, the circuit connection device includes a harness 506 to connect to circuit boards (not shown) and a ground line 506a to connect the grounds of the circuit boards (not shown) and winding around the harness 506. The ground line 506a is one of a plurality of signal lines included in the harness 506 to connect the grounds of the circuit boards. It is possible to use a digital ground for a digital signal rather than an analog ground for an analog signal.

The ground line 408 illustrated in FIG. 4 and the ground line 506a illustrated in FIG. 5 wind around the harnesses 406 and 506, respectively, and form a short return path.

As is well known, whether or not a return path is obtained during transmission of a signal can influence EMI emission.

Figure 6:
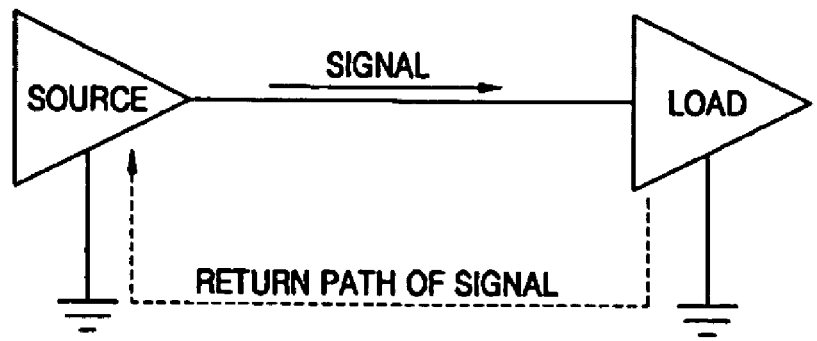
FIG. 6 is a schematic diagram illustrating a concept of a return path.

FIG. 6 is a schematic diagram illustrating the concept of a return path.

To operate all electronic circuits, a closed loop should be formed. Through the closed loop, a signal from a source is used in a load and then returns to the source. The path of the signal returning to the source is a return path.

Figure 7A:
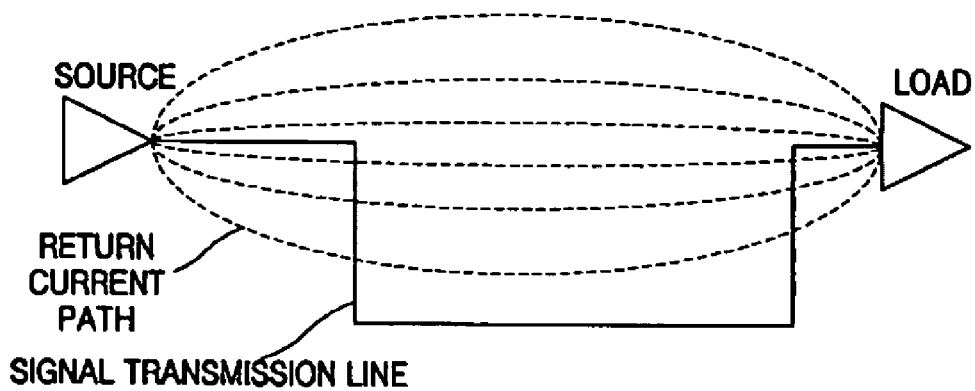
FIGS. 7A and 7B are schematic diagrams illustrating return paths of a low frequency signal and a high frequency signal, respectively.
Figure 7B:
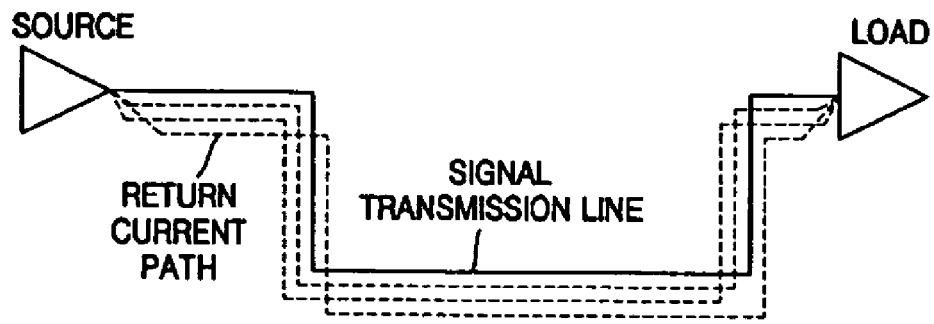

FIGS. 7a and 7B are schematic diagrams illustrating return paths of a low frequency signal and a high frequency signal, respectively. Referring to FIGS. 7A and 7B, while a low frequency signal tends to return along a path with the lowest impedance, a high frequency signal tends to return along a path with the lowest inductance.

Referring to FIG. 7A, when the low frequency signal returns from a load to a source, it returns, regardless of a signal transmission path, along a path of lowest impedance, that is, an arc-shaped path shown with a dotted line in FIG. 7A. On the other hand, referring to FIG. 7B, when the high frequency signal returns from a load to a source, it returns along a path of lowest inductance, that is, a path, which is formed adjacent to a signal transmission line, shown with a dotted line in FIG. 7B. In the embodiments of the present general inventive concept illustrated in FIGS. 4 and 5, a short return path is formed due to the ground line 408 or 506a winding around the harness 406 or 506.

Meanwhile, an emission energy through the signal transmission line is proportional to an area of the loop formed between the signal transmission line and the return path.

The emission energy E satisfies the equation:

$$E \propto f^2 * A * I$$

Here, 'f' denotes a frequency of a signal transmitted through the signal transmission line, 'A' denotes an area between the signal transmission line and the return path, and 'I' denotes an amplitude of the signal.

Figure 8A:
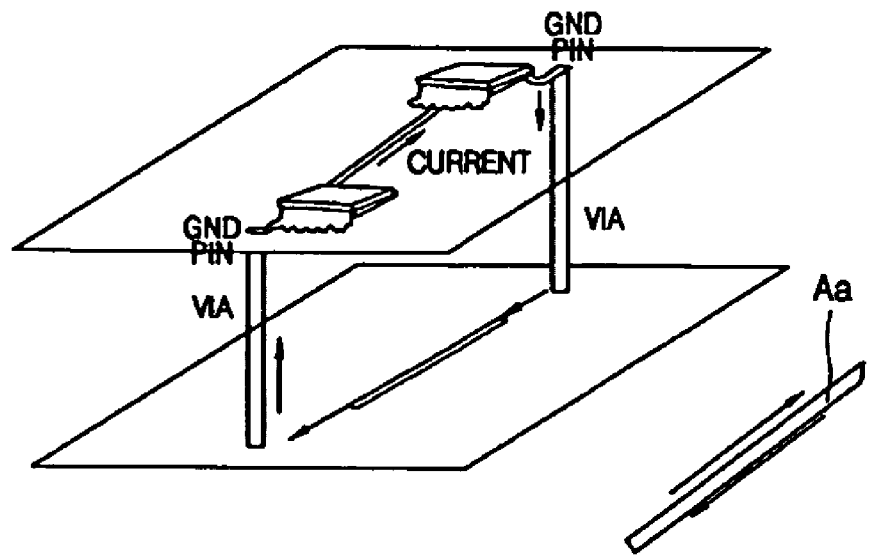
FIGS. 8A and 8B are schematic diagrams illustrating effects caused by an area of a return path.
Figure 8B:
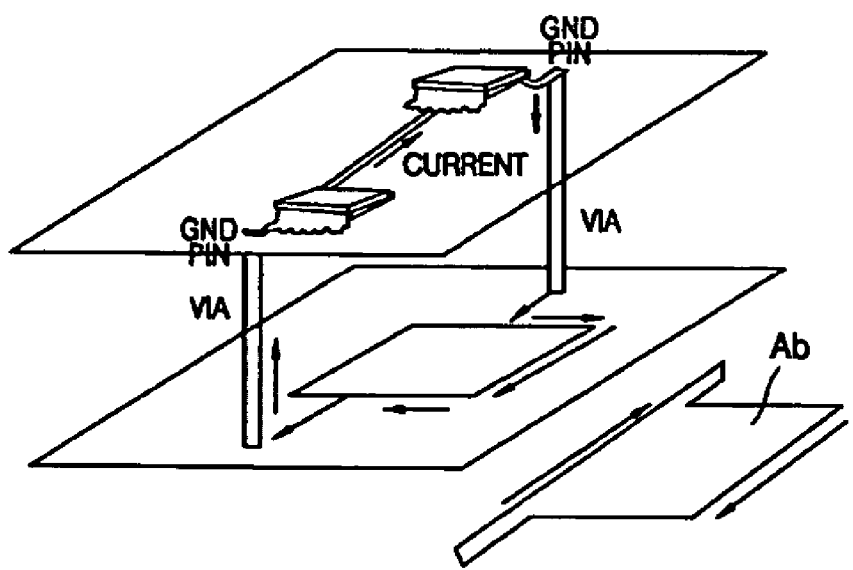

FIGS. 8A and 8B are schematic diagrams illustrating effects caused by the area of the return path. FIGS. 8A and 8B illustrate the area of the return path between an upper board and a lower board of a printed circuit board formed with two layers. Since the area of the return path of FIG. 8A is smaller than the area of the return path of FIG. 8B (Aa>Ab), the emission energy of the circuit of FIG. 8A is less than the emission energy of the circuit of FIG. 8B. The return path with the smaller area Aa is formed due to the ground line 408 or 506a winding around the harness 406 or 506, respectively, as illustrated in FIGS. 4 and 5.

Thus, according to the embodiments of the present general inventive concept, the ground line 408 or 506a functions as a guard ground for the signal transmission line, thus forming a short and narrow return path, and thereby reducing EMI emission.

The ground lines 408 and 506a illustrated in FIGS. 4 and 5, respectively, constitute loop antennas. A characteristic of a loop antenna is that emission does not occur when a wavelength of a signal to be transmitted is smaller than $\lambda\_th/20$. $\lambda\_th/20$ is a critical wavelength determined by a distance between ground connections.

Accordingly, the space L between turns of the ground line 408 or 506a winding around the harness 406 or 506, that is, the space between ground connections, is set less than one twentieth of $\lambda\_min$ to obtain a shielding effect, the one-twentieth of $\lambda\_min$ corresponds to the frequency which leads to electromagnetic interference.

Figure 9:
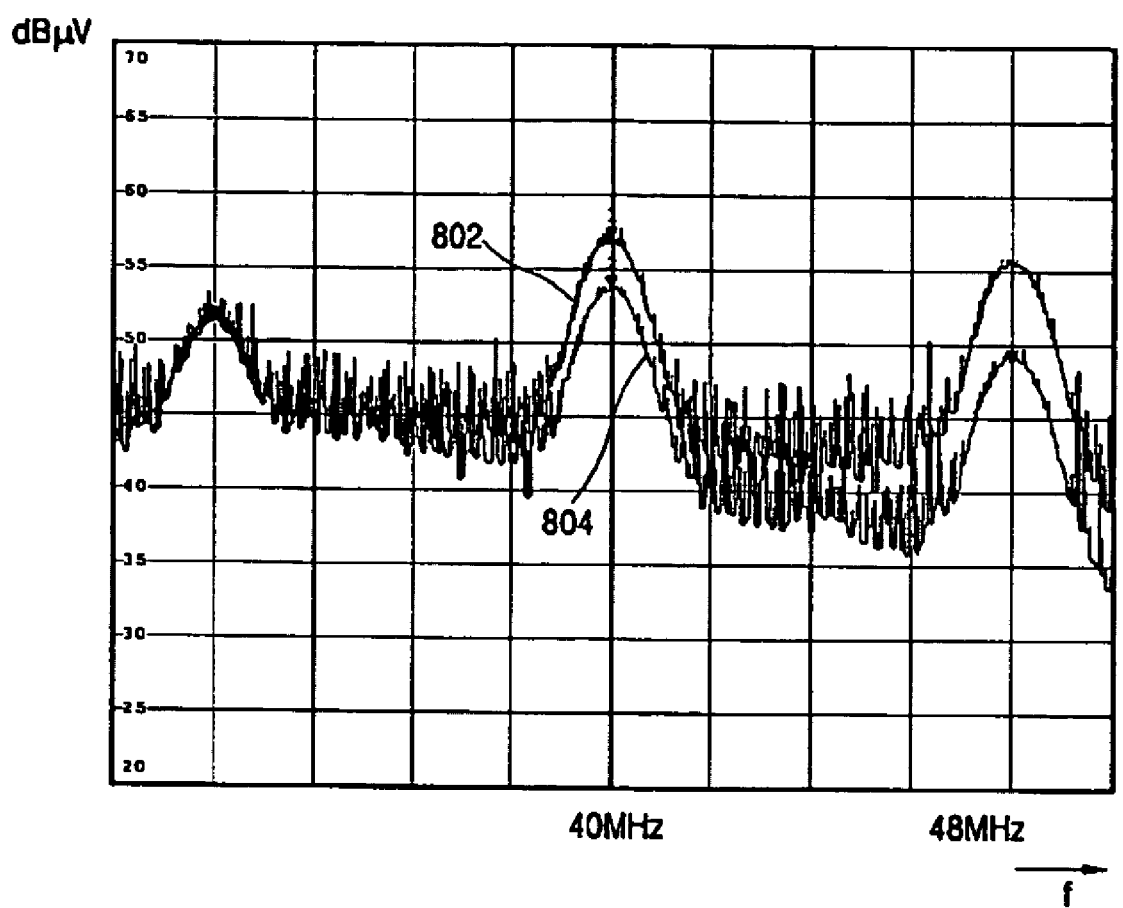
FIG. 9 is a waveform diagram illustrating an effect of an electromagnetic interference reducing method according to an embodiment of the present general inventive concept.

FIG. 9 is a waveform diagram illustrating an effect of an electromagnetic interference reducing method according to the embodiments of the present general inventive concept. In FIG. 9, an upper waveform 802 is a harmonic frequency generated by a conventional ADF harness without a ground line, such as those illustrated in FIG. 1, and a lower waveform 804 is a harmonic frequency generated by an ADF harness generated when the ground line 408 is wound around the harness 406 as illustrated in FIG. 4.

As illustrated in FIG. 9, a fundamental frequency is 8 MHz, and the frequencies leading to electromagnetic interference are 40 MHz and 48 MHz.

As a result of applying the ground line 408, at a frequency of 40 MHz, the harmonic frequency is reduced by approximately 4 dB, from 57.06 to 53.77 dBμV. Also, at a frequency of 48 MHz, the harmonic frequency is reduced by approximately 7 dB, from 55.74 to 48.91 dB6μV.

As described above, according to embodiments of the present general inventive concept, an electromagnetic reducing method reduces EMI efficiently with low cost and easy installation.

Further, according to embodiments of the present general inventive concept, an electromagnetic reducing method can be employed at any time during a development process or a manufacturing process of a product, or even after the product is shipped. In addition, there are no side effects such as an extension of length of the harness depending on the number of turns of the harness around a ferrite core and no problems occur at frequencies besides the frequency originally leading to interference, which can result from extending the length of the harness when a ferrite core is used. Also signal distortion due to parasitic capacitance between a shield and a harness does not occur, as in the case when a shield is used.

As described above, an electromagnetic interference reducing method is capable of reducing electromagnetic interference without any side effects by using a low cost and a simple ground line.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of reducing electromagnetic interference resulting from a harmonic wave emitted from a signal which is transmitted through a harness, the method comprising:
    winding a conductive wire at least once around the harness, comprising:
        maintaining a space between turns of the conductive wire according to the equation:

$L \leq 1/(20*F\text{max}) = \lambda\text{min} * 1/20$, where Fmax and λmin denote a highest frequency and a shortest wavelength of the harmonic wave, respectively, and L denotes the space between the turns of the conductive wire; and
    grounding at least one end of the conductive wire.

2. The method of claim 1, wherein the grounding of at least one end of the conductive wire comprises:
    connecting the conductive wire to a metal frame at which one of plural electronic circuits connected by the harness is installed.

3. The method of claim 1, wherein the conductive wire is one of plural signal lines of the harness, and the grounding of at least one end of the conductive wire comprises:
    connecting the conductive wire to digital grounds of electronic circuit connected by the harness.

4. The method of claim 1, further comprising:
    attaching the conductive wire to the harness to maintain a constant position of the conductive wire with respect to the harness.

5. A method of connecting plural electronic components to transmit a signal therebetween, the method comprising:
    connecting the electronic components with a harness to transmit the signal through the harness;
    winding a signal wire around the harness one or more times to reduce electromagnetic interference resulting from a harmonic wave emitted from the signal; and
    maintaining a space between turns of the signal wire according to the equation:

$L \leq 1/(20*F\text{max}) = \lambda\text{min} * 1/20$, where Fmax and λmin denote a highest frequency and a shortest wavelength of the harmonic wave, respectively, and L denotes the space between the turns of the signal wire.

6. The method of claim 5, further comprising:
    grounding the signal wire.

7. The method of claim 6, wherein the grounding of the signal wire comprises:
    connecting the signal wire to a metal frame at which one of the electronic components connected by the harness is installed to ground the signal wire.

8. The method of claim 6, wherein the grounding of the signal wire comprises:
    electronically connecting the signal wire to digital ground terminals of the electronic components connected by the harness to ground the signal wire.

9. The method of claim 5, wherein the winding of the signal wire around the harness comprises:
    attaching the signal wire to the harness to fix a position of the signal wire with respect to the harness.

10. A circuit connection device to transmit a signal between separated electronic circuits, the circuit connection device comprising:
    a plurality of signal lines; and
    a ground line winding at least once around the plurality of signal lines, wherein at least one of the ends of the ground line is connected to a ground and where a space is provided between turns of the ground wire wound around the plurality of signal lines, according to the equation:

$L \leq 1/(20*F\text{max}) = \lambda\text{min} * 1/20$, where L denotes the space between the turns of the ground wire and Fmax and λmin denote a highest frequency and a shortest wavelength of a harmonic wave which is emitted from the plurality of signal lines, respectively.

11. The circuit connection device of claim 10, wherein at least one of the separated electronic circuits is installed at a metal frame, and the ground line is connected to the metal frame.

12. The circuit connection device of claim 10, wherein the ground in comprises one of the plurality of signal lines and is connected to digital grounds of the separated electronic circuits.

13. The circuit connection device of claim 10, wherein the ground line comprises one of a conductive wire and a coated line.

14. The circuit connection device of claim 10, wherein the ground line is attached to the plurality of signal lines to maintain a constant position with respect to the plurality of signal lines.

15. The circuit connection device of claim 10, wherein the ground line winds around the plurality of signal lines such that an area of a return path of the signal transmitted between the separated electronic circuits is minimized.

16. A circuit connection device to transmit a signal between separated electronic circuits, comprising:
- a harness to transmit a signal between the separated electronic circuits; and
- a signal line winding at least once around the harness to reduce electromagnetic inference resulting from a harmonic wave emitted from the signal, the signal line maintaining a space between turns of the signal line according to the equation:

$$L \leq 1/(20*F\text{max}) = \lambda\text{min}*1/20,$$

where Fmax and λmin denote a highest frequency and a shortest wavelength of the harmonic wave, respectively, and L denotes the space between the turns of the signal line.

17. The circuit connection device of claim 16, wherein at least one of the separated electronic circuits is installed at a metal frame, and the signal line is connected to the metal frame to ground the signal line.

18. The circuit connection device of claim 16, wherein the signal line is electronically connected to digital ground terminals of the separated electronic circuits to ground the signal line.

* * * * *